(12) United States Patent
Huang et al.

(10) Patent No.: US 10,804,267 B2
(45) Date of Patent: Oct. 13, 2020

(54) EMBEDDED SEMICONDUCTOR REGION FOR LATCH-UP SUSCEPTIBILITY IMPROVEMENT

(71) Applicant: Taiwan Semiconductor Manufacturing Co., Ltd., Hsinchu (TW)

(72) Inventors: Chien Yao Huang, Taipei (TW); Yu-Ti Su, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/881,215

(22) Filed: Jan. 26, 2018

(65) Prior Publication Data

US 2019/0096886 A1    Mar. 28, 2019

Related U.S. Application Data

(60) Provisional application No. 62/564,796, filed on Sep. 28, 2017.

(51) Int. Cl.
*H01L 27/092* (2006.01)
*H01L 29/10* (2006.01)
(Continued)

(52) U.S. Cl.
CPC ........ *H01L 27/0921* (2013.01); *H01L 21/761* (2013.01); *H01L 21/823892* (2013.01);
(Continued)

(58) Field of Classification Search
CPC .............. H01L 27/092; H01L 27/0921; H01L 27/0925; H01L 27/0927; H01L 27/0928; H01L 27/10; H01L 29/1075; H01L 29/1083; H01L 29/41725; H01L 29/1728; H01L 29/435; H01L 29/49; H01L 29/66045; H01L 29/66068; H01L 29/66477; H01L 29/66484; H01L 29/76; H01L 29/778; H01L 29/6659;
(Continued)

(56) References Cited

U.S. PATENT DOCUMENTS 6,753,575 B2 *   6/2004   Efland ................... H01L 21/761
                                                       257/335
6,815,794 B2 *   11/2004  Shin ...................... H01L 21/761
                                                       257/287
(Continued)

*Primary Examiner* — Natalia A Gondarenko
(74) *Attorney, Agent, or Firm* — Sterne, Kessler, Goldstein & Fox P.L.L.C.

(57) ABSTRACT

The present disclosure describes a metal-oxide-semiconductor field-effect transistor (MOSFET) device. The MOSFET device includes a first-type substrate, a deep-second-type well in the first-type substrate, a first-type well over the deep-second-type well, and a second-type well over the deep-second-type well. The second-type well and the deep-second-type well form an enclosed space that includes the first-type well. The MOSFET also includes an embedded semiconductor region (ESR) in a vicinity of the enclosed space. The ESR includes a dopant concentration lower than at least one of a dopant concentration of the first-type well, a dopant concentration of the second-type well, and a dopant concentration of the deep-second-type well.

20 Claims, 12 Drawing Sheets

(51) Int. Cl.
    *H01L 29/06*       (2006.01)
    *H01L 29/66*       (2006.01)
    *H01L 21/74*       (2006.01)
    *H01L 21/8238*     (2006.01)
    *H01L 21/761*      (2006.01)
    *H01L 29/78*       (2006.01)

(52) U.S. Cl.
    CPC .......... *H01L 29/1083* (2013.01); *H01L 21/74* (2013.01); *H01L 29/78* (2013.01)

(58) Field of Classification Search
    CPC ............... H01L 29/66681; H01L 29/78; H01L 29/7801; H01L 29/7816; H01L 29/7832; H01L 29/7833; H01L 29/94; H01L 21/823892; H01L 21/74; H01L 21/26513; H01L 21/26506; H01L 21/2652; H01L 21/266; H01L 21/823814; H01L 2027/1189; H01L 2027/11892; H01L 2924/1306; H01L 2924/13091; H01L 2924/13092; H01L 29/402; H01L 29/42725; H01L 29/7823; H01L 29/7835; H01L 29/0619; H01L 29/0634; H01L 29/0696; H01L 29/086; H01L 29/0878; H01L 29/0922; H01L 29/1095
    USPC ....... 257/328, 335, 339, 343, 336, 372, 655, 257/E29.256
    See application file for complete search history.

(56) References Cited

U.S. PATENT DOCUMENTS

| | | | |
|---|---|---|---|
| 6,878,996 B2* | 4/2005 | Rothleitner | H01L 27/092 257/341 |
| 9,111,785 B2* | 8/2015 | Gregory | H01L 21/823807 |
| 10,074,644 B2* | 9/2018 | Kim | H01L 21/761 |
| 2010/0264508 A1* | 10/2010 | Stecher | H01L 21/26506 257/503 |
| 2015/0325485 A1* | 11/2015 | Ng | H01L 21/823487 438/268 |
| 2016/0118495 A1* | 4/2016 | Chen | H01L 29/7835 257/343 |

* cited by examiner

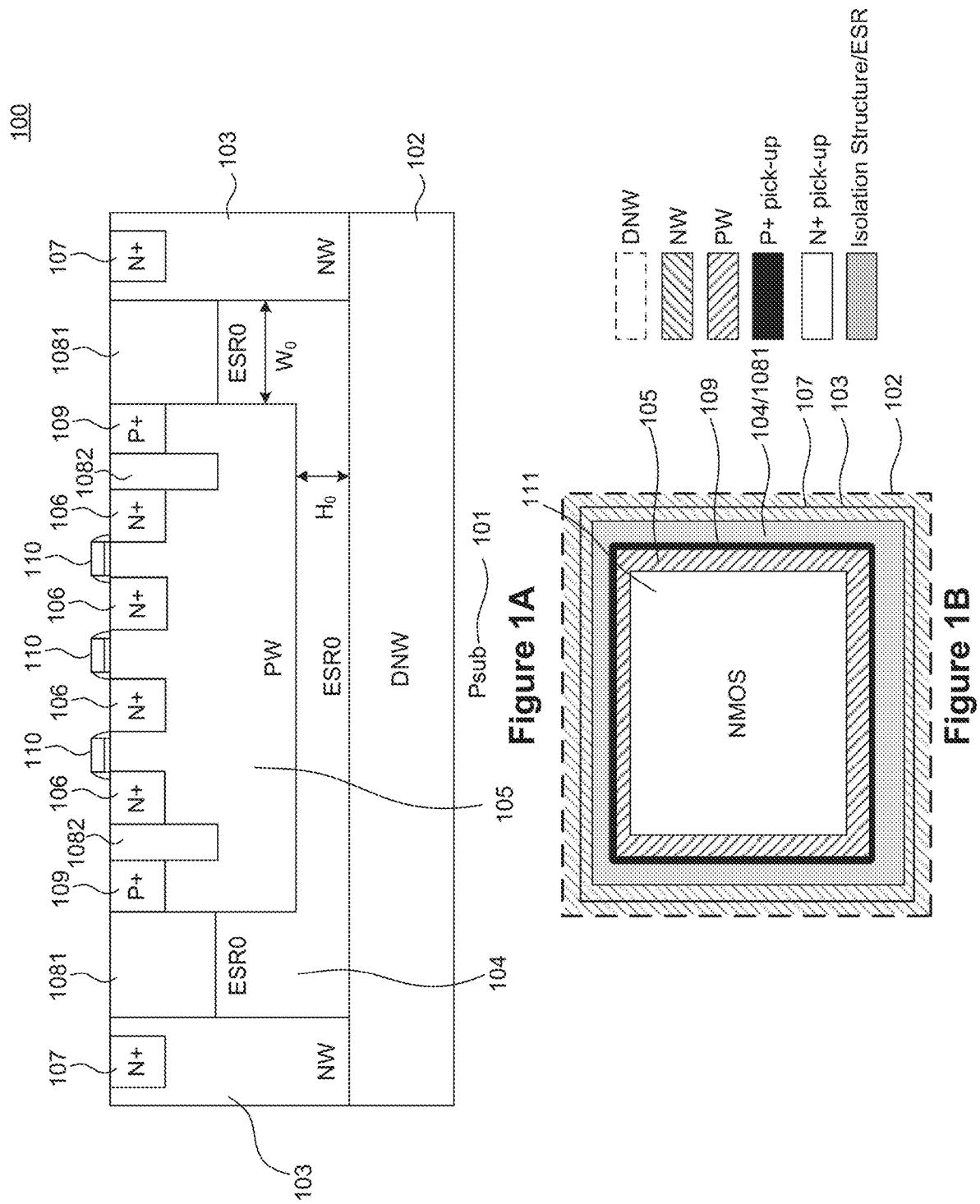

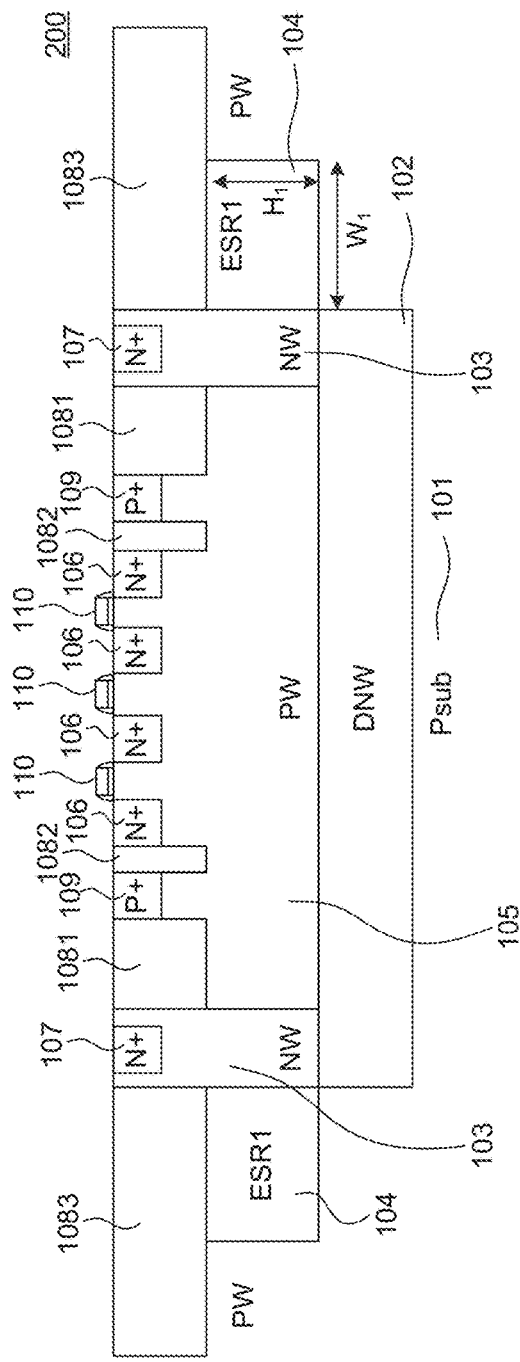
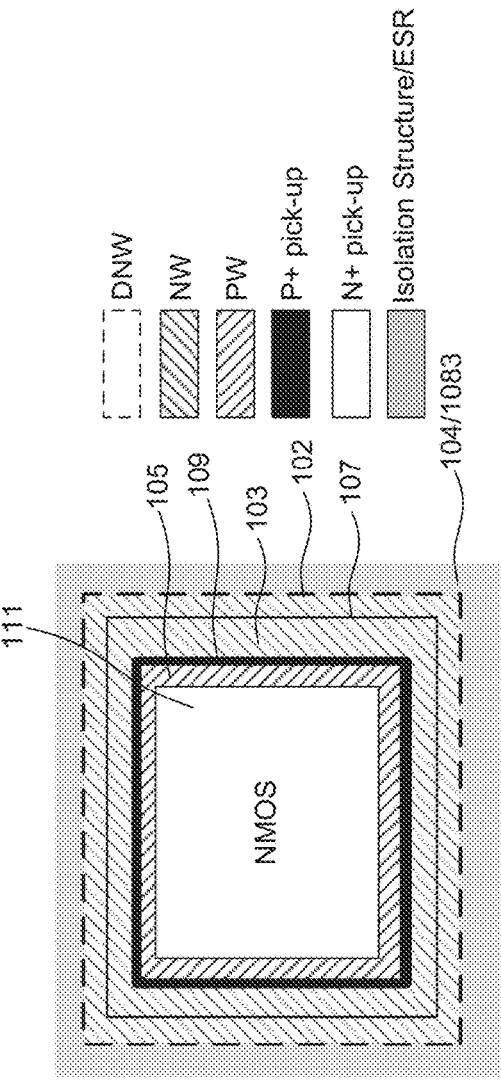
Figure 2A
Figure 2B

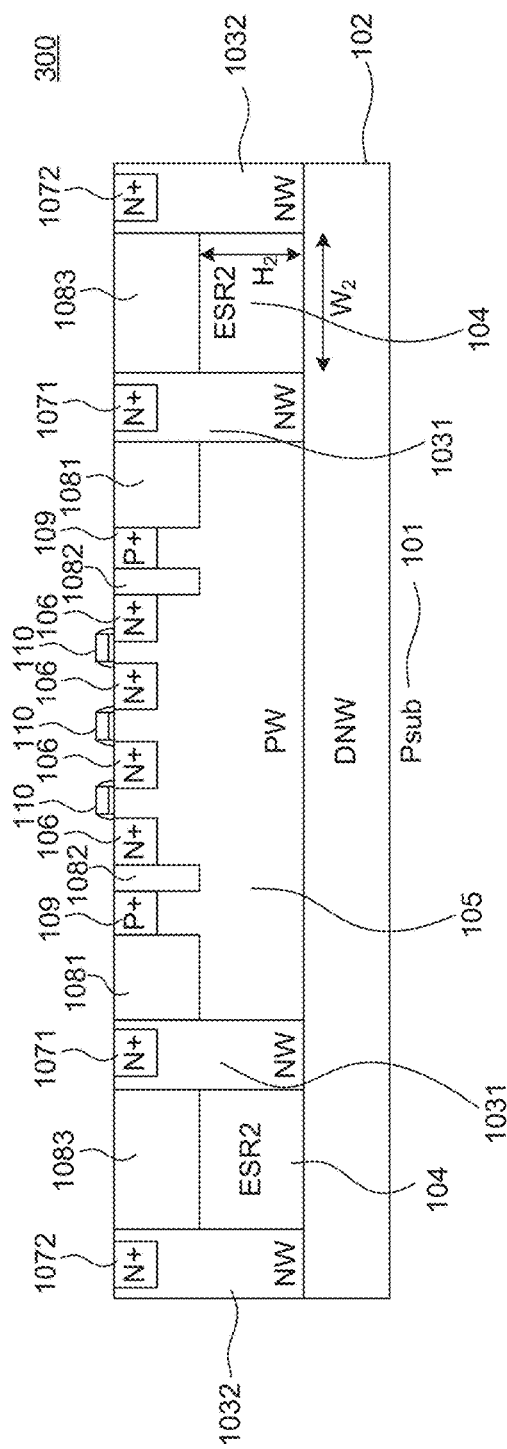
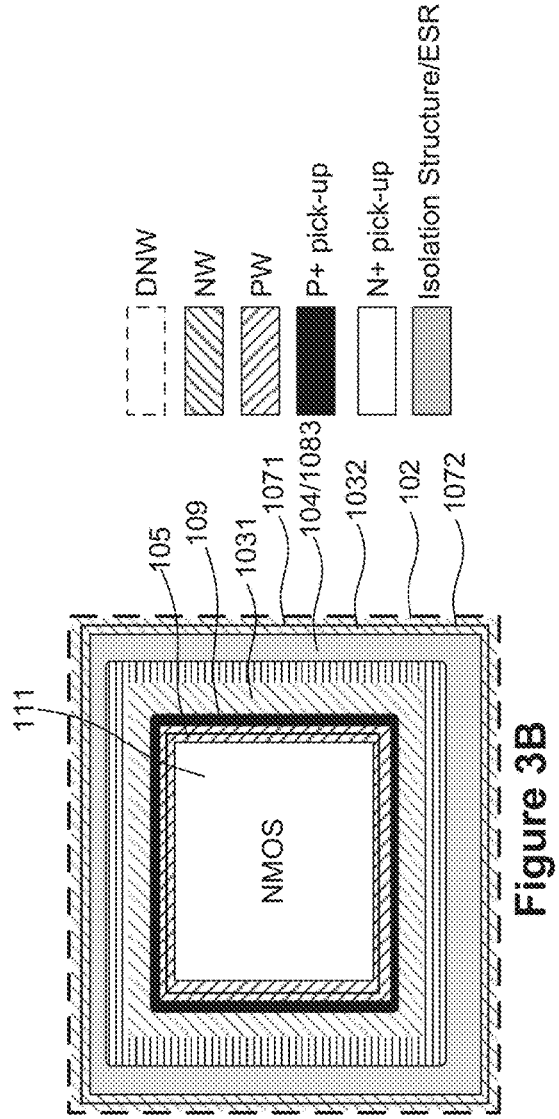
Figure 3A
Figure 3B

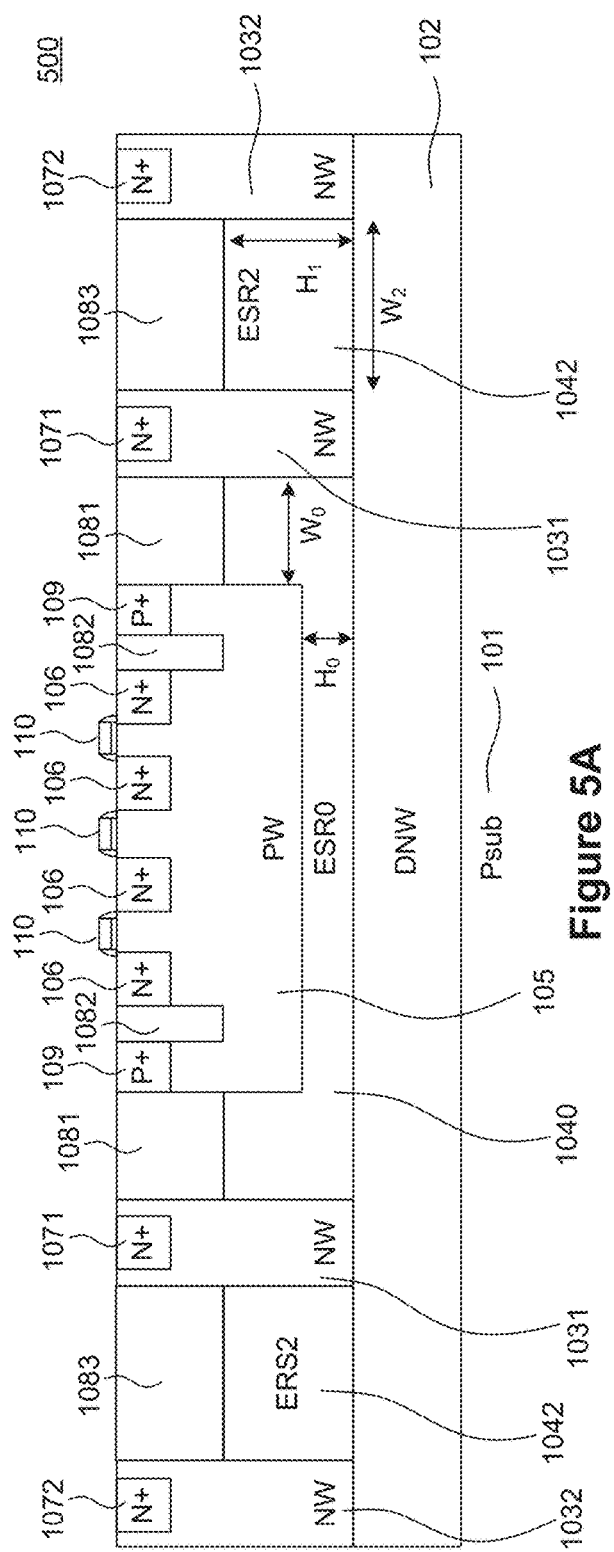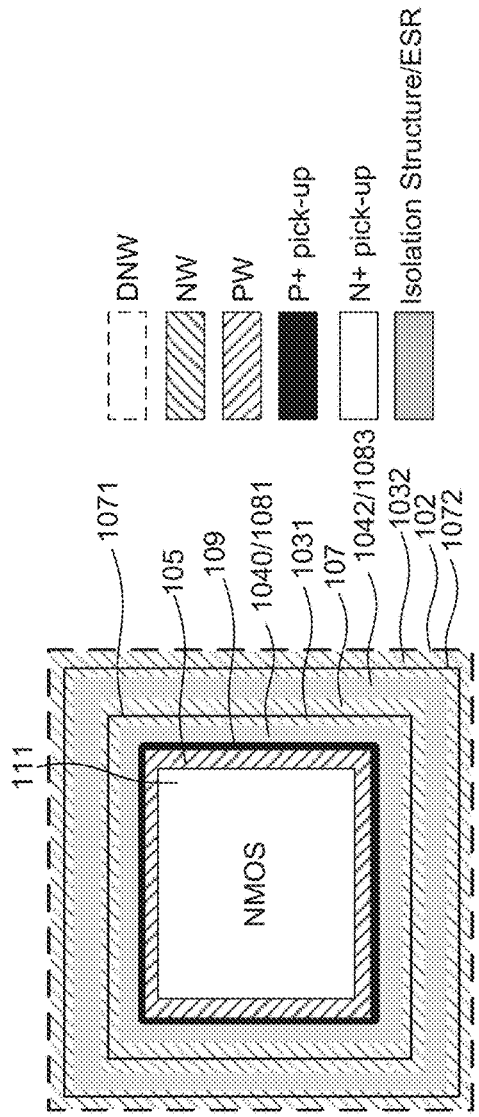
Figure 5A
Figure 5B

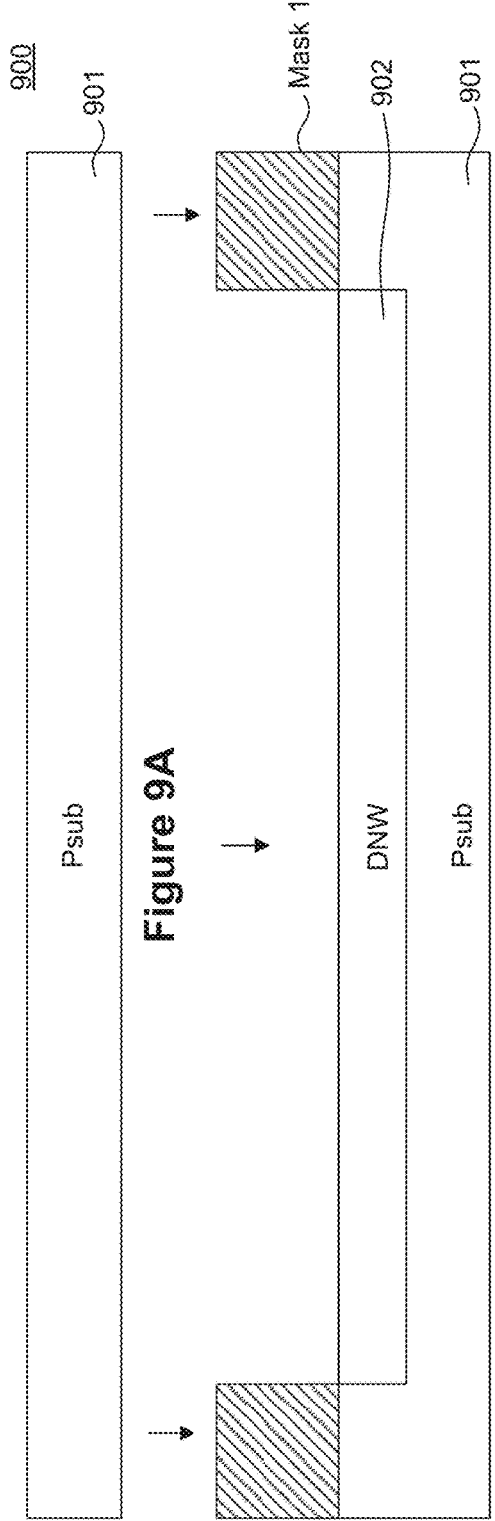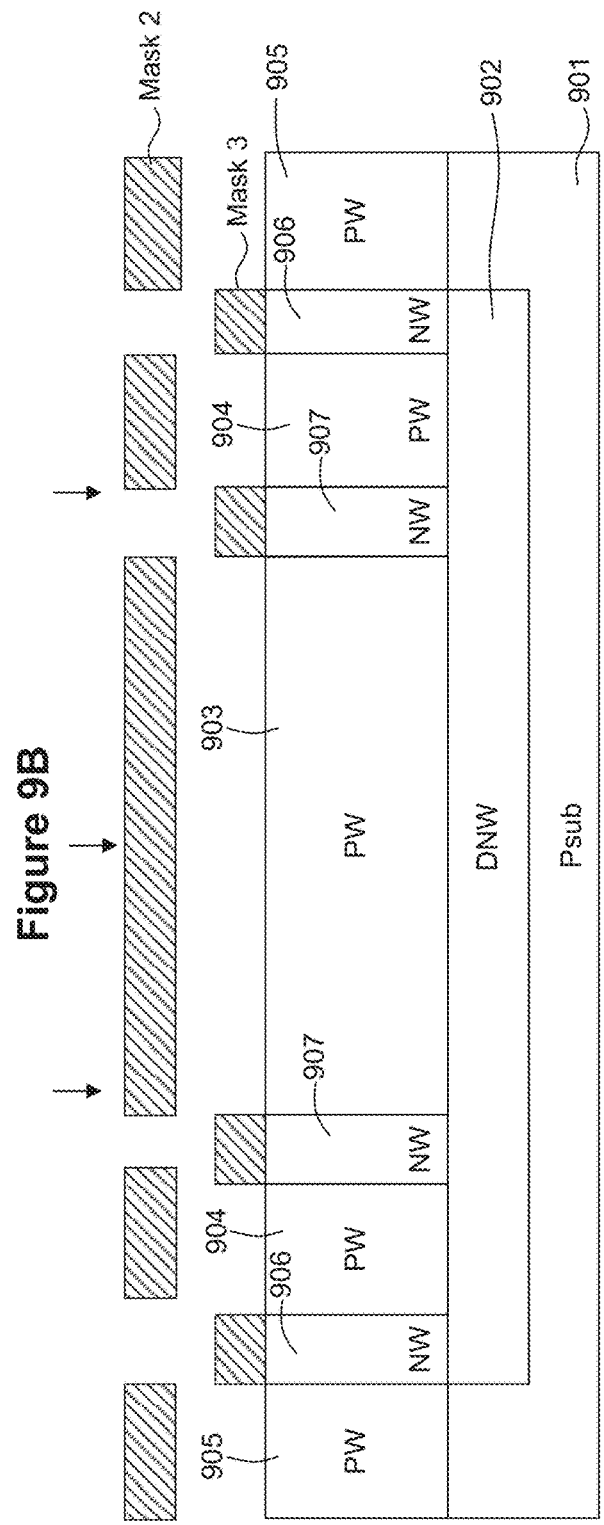

US 10,804,267 B2

EMBEDDED SEMICONDUCTOR REGION FOR LATCH-UP SUSCEPTIBILITY IMPROVEMENT

CROSS-REFERENCE TO RELATED APPLICATION

This application claims priority of U.S. Provisional Patent Application No. 62/564,796, titled "Embedded Semiconductor Region For Latch-up Susceptibility Improvement," filed Sep. 28, 2017, the disclosure of which is incorporated by reference in its entirety.

BACKGROUND

As a key component in semiconductor industry, complementary metal-oxide-semiconductor field-effect transistors (CMOSFETs or CMOS) play an important role in various electronic devices. To eliminate noise in CMOS structures, deep N-well (DNW) structures have been formed between a P-type substrate (p-sub) and electrodes formed thereon. During operation, DNW structures and the P-type substrate can form a reversed p-n junction to isolate noise generated in the electrodes from entering into the P-type substrate and neighboring structures.

For CMOS structures, a problem can be the device's vulnerability to an undesirable conduction mechanism known as "latch-up." Latch-up can be a short circuit condition where a low-impedance path can be formed between a power supply (e.g., VDD) and ground (e.g., VSS) of the CMOS structure, causing the circuit to have a high current between VDD and VSS. The low-impedance path triggers a parasitic structure which disrupts proper circuit operation, possibly even leading to destruction of the circuit due to overcurrent.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

FIG. 1A is an illustration of an example cross-sectional view of an n-channel MOS field-effect transistor (NMOSFET) device, according to some embodiments.

FIG. 1B is an illustration of an example top view of the NMOSFET device in FIG. 1A, according to some embodiments.

FIG. 2A is an illustration of an example cross-sectional view of another NMOSFET device, according to some embodiments.

FIG. 2B is an illustration of an example top view of the NMOSFET device in FIG. 2A, according to some embodiments.

FIG. 3A is an illustration of an example cross-sectional view of another NMOSFET device, according to some embodiments.

FIG. 3B is an illustration of an example top view of the NMOSFET device in FIG. 3A, according to some embodiments.

FIG. 5A is an illustration of an example cross-sectional view of another NMOSFET device, according to some embodiments.

FIG. 5B is an illustration of an example top view of the NMOSFET device in FIG. 5A, according to some embodiments.

FIGS. 9A-9F are illustrations of example cross-sectional views of an NMOSFET device at various stages during a fabrication process, according to some embodiments.

DETAILED DESCRIPTION

Figure 4A:
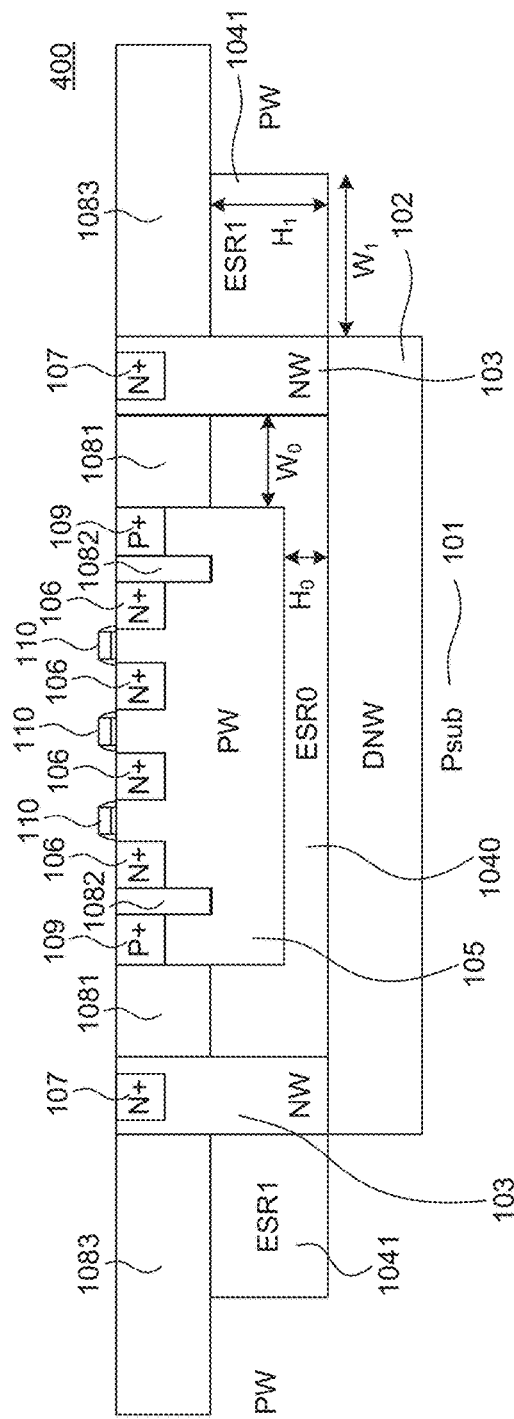
FIG. 4A is an illustration of an example cross-sectional view of another NMOSFET device, according to some embodiments.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

An issue with CMOS devices is the latch-up phenomenon (also referred to herein as "latch-up"). In a CMOS device, heavily doped N-type regions and/or electrodes and heavily doped P-type regions and/or electrodes of adjacent MOSFET devices can form parasitic bipolar junction transistors (BJTs) equivalent to a thyristor. Causes such as, voltage spike in the circuit, high supply voltage, ionizing radiation, and high-power microwave interference can trigger the BJTs to operate in saturation. For example, in a CMOS device that has a DNW between the P-type substrate and the electrodes, PNPN or PNPNPN structures can form between heavily doped sources and drains of neighboring/adjacent NMOSFETs devices or n-channel MOSFETs (PMOSFETs) devices, and the DNW is in the current flow path of the parasitic structures. These structures can form thyristors in the operation of the circuit, thus increasing the circuit's susceptibility to latch-up.

The present disclosure describes an embedded semiconductor region (ESR) structure formed in the vicinity of the DNW of a NMOSFET device (or the DPW of a PMOSFET device) to reduce latch-up in the NMOSFET (or the PMOSFET) device. A benefit, among others, of forming the ESR structure is to reduce the current along parasitic latch-up paths in the device. By reducing the current generated by parasitic structures along the latch-up paths, a holding voltage of the latch-up paths can be increased, thus reducing the occurrence of latch-up and improving device performance. Further, high-temperature induced holding voltage degradation can be suppressed. In some embodiments, the formation of the ESR structure is compatible with CMOS fabrication processes and does not require additional masks to fabricate the CMOS device.

For illustrative purposes, the present disclosure is described based on the structure and formation of an NMOSFET device. In the Detailed Description, similar or same parts in an NMOSFET device are labeled using same element numbers. However, element numbers are merely used to distinguish relevant parts in the Detailed Description and do not indicate any similarity or difference in functionalities, compositions, or locations. The NMOSFET devices 100-600 illustrated in FIGS. 1A and 1B to FIGS. 6A and 6B are each part of a CMOS device in a chip. Other parts of the CMOS devices are not shown for ease of description. For example, an NMOSFET device can be adjacent/connected to a P-type well, which underlies an isolation structure. The P-type well can be a part of a PMOSFET of the CMOS device.

FIGS. 1A and 1B are illustration of an exemplary NMOSFET device 100 containing an ESR structure, according to some embodiments. As shown in FIG. 1A, in some embodiments, NMOSFET device 100 includes a p-substrate (also referred to as Psub) 101, a DNW 102 over Psub 101, an N-well (NW) 103 over DNW 102, an ESR0 104 over DNW 102 and between NW 103, and a P-well (PW) 105 over ESR0 104. NMOSFET device 100 further includes a heavily-doped N-type region (N+ region) 107 in NW 103, isolation structures 108₁ and 108₂ respectively over ESR0 104 and in PW 105, a heavily-doped P-type region (P+ region) 109 in PW 105, and NMOSFETs 111. For illustrative purposes, NMOSFETs 111 include three NMOSFETs, each including a gate structure 110 and two heavily doped N-type source and drain regions 106. Adjacent NMOSFETs share an N-type source and drain region 106. NMOSFETs 111 are insulated from P+ region 109 by isolation structure 108₂.

Psub 101 can be any suitable P-type substrate. In some embodiments, Psub 101 can be a silicon substrate. In some embodiments, Psub 101 includes another elementary semiconductor, such as germanium, a compound semiconductor including silicon carbide, allium arsenide, gallium phosphide, indium phosphide, indium arsenide, and/or indium antimonide; an alloy semiconductor including SiGe, GaAdP, AlInAs, AlGaAs, GaInAs, GaInP, and/or GaInAsP; or combinations thereof. In some embodiments, Psub 101 is a semiconductor on insulator (SOI). In some embodiments, Psub 101 is an epitaxial material.

NW 103 can be a region surrounding NMOSFET 111s and can be doped with N-type dopants. N+ region 107 can be formed in NW 103 and can be heavily doped with N-type dopants that are the same as or different from the dopants of NWs 103. NW 103 and N+ region 107 can be made of one or more of silicon, germanium, silicon carbide, allium arsenide, gallium phosphide, indium phosphide, indium arsenide, antimonide, SiGe, GaAdP, AlInAs, AlGaAs, GalnAs, GaInP, and GaInAsP. In some embodiments, NW 103, N+ region 107, and Psub 101 are made of the same material, e.g., silicon, and NW 103 and N+ region 107 are doped with any suitable N-type dopants such as one or more of phosphorous, arsenic, antimony, bismuth, lithium, etc. In some embodiments, N+ region 107 can be doped with N-type dopants after NW 130 can be formed. In some embodiments, the dopant concentrations of NWs 103 is in the range of about $10^{17}$-$10^{21}$ atoms/cm³. In some embodiments, the dopant concentration of N+ region 107 is in the range of about $10^{18}$-$10^{23}$ atoms/cm³. NW 103 and N+ region 107 are formed by one or more of ion implantation, ion diffusion, in-situ doping with epitaxial deposition, and any other suitable fabrication methods.

DNW 102 can be a doped region located deeper in Psub 101 than the doped wells surrounding the CMOS device and/or other devices. For example, DNW 102 can be formed on (e.g., directly on) Psub 101. In some embodiments, DNW 102 includes one or more of silicon, germanium, silicon carbide, allium arsenide, gallium phosphide, indium phosphide, indium arsenide, antimonide, SiGe, GaAdP, AlInAs, AlGaAs, GalnAs, GaInP, and GaInAsP, and can be doped with any suitable N-type dopants. DNW 102 has an area larger than NMOSFETs 111 and reduces noise between the CMOS device and Psub 101 by providing a low-impedance path for the noise to travel to a ground node rather than being affected by the devices surrounded by NMOSFET 111s. In some embodiments, DNW 102 is made of silicon and can be doped with N-type dopants such as one or more of phosphorous, arsenic, antimony, bismuth, lithium, etc. In some embodiments, the dopant concentration of DNW 102 is in the range of about $10^{15}$-$10^{16}$ atoms/cm³. DNW 102 can be formed by any suitable process such as ion implantation, ion diffusion, and/or in-situ doping with epitaxial deposition. Other fabrication techniques for forming DNW 102 are also possible.

ESR0 104 can be formed between DNW 102 and PW 105, and can be surrounded by NW 103. ESR0 104 can be doped with P-type or N-type dopants. In some embodiments, ESR0 104 includes silicon and is doped with P-type dopants, including one or more of boron, aluminum, nitrogen, gallium, indium, and any other suitable dopants. In some embodiments, ESR0 104 includes silicon and is doped with N-type dopants, including one or more of phosphorous, arsenic, antimony, bismuth, lithium, and any other suitable dopants. The dopant concentration of ESR0 can be lower than the dopant concentrations of one or more of PW 105, NW 103, and DNW 102, and can be in the range of about 0 to $10^{19}$ atoms/cm³. In some embodiments, the dopant concentration of ESR0 is lower than the dopant concentrations of PW 105, NW 103, and DNW 102. The dopant concentration of "0" in the disclosure can represent the intrinsic doping level of the material (e.g., material that PW 105 is made of.) In some embodiments, the dopant concentration of ESR0 is in the range of about $10^{15}$ to $10^{17}$ atoms/cm³. ESR0 104 can be made of a material that is the same as or different from the material of DNW 102 and/or Psub 101. In some embodiments, ESR0 104 is made of one or more of silicon, germanium, silicon carbide, allium arsenide, gallium phosphide, indium phosphide, indium arsenide, antimonide, SiGe, GaAdP, AlInAs, AlGaAs, GalnAs, GaInP, and GaInAsP. ESR0 104 can be doped with dopants/ions that is same as or different from the dopants/ions in one or more of PW 105, NW 103, and DNW 102. ESR0 104 can be formed by ion implantation, ion diffusion, and/or in-situ doping with epitaxial deposition. In some embodiments, ESR0 104, DNW 102, PW 105, and Psub 101 are made of the same material, and ESR0 can be formed by ion implantation in PW 105.

In some embodiments, ESR0 104 is made of a different material than PW 105 and/or DNW 102 and can be formed by any suitable deposition process, e.g., one or more of chemical vapor deposition (CVD), physical vapor deposition (PVD), plasma-enhanced CVD (PECVD), molecular beam epitaxy (MBE), sputtering, atomic layer deposition (ALD), and metal-organic chemical vapor deposition (MOCVD). N-type or P-type dopants can be doped into ESR0 104 by ion implantation, ion diffusion, and/or in-situ doping with epitaxial deposition. Other parts/layers, e.g., PW 105, can be formed by any suitable deposition or doping process over ESR0 104. Other fabrication techniques for forming ESR0 104 are also possible.

In some embodiments, the cross-section of ESR0 104 has a "U" shape. As shown in FIG. 1A, ESR0 104 has a peripheral upper surface surrounding a central upper surface, a bottom surface over DNW 102, and sidewalls against NW 103. Peripheral upper surface can be formed under isolation structure 1081 and central upper surface can be formed under PW 105. In some embodiments, ESR0 and isolation structure 1081 extend along an inner sidewall (e.g., extend along the entire sidewall) of NW 103. A width W0 of a peripheral upper surface of ESR0 can be in the range of about 0.1-10 µm. In some embodiments, the width W0 is in the range of about 0.1-5 µm. A height H0 of ESR0 104, the vertical distance (e.g., y-direction) between the upper surface of DNW 102 and central upper surface can be in the range of about 0.1-10 µm. In some embodiments, the height H0 is in the range of about 0.1-5 µm.

PW 105 can be a P-type well formed over ESR0 104. In some embodiments, PW 105 can be formed by doping Psub 101 using any suitable doping method such as ion implantation and ion diffusion. In some embodiments, PW 105 is formed by any suitable deposition process, e.g., one or more of CVD, PVD, MBE, PECVD, sputtering, ALD, and CVD, over ESR0 104. Other fabrication techniques for forming PW 105 are also possible. PW 105 may include any suitable material such as one or more of silicon, germanium, silicon carbide, allium arsenide, gallium phosphide, indium phosphide, indium arsenide, antimonide, SiGe, GaAdP, AllnAs, AlGaAs, GaInAs, GaInP, and GaInAsP. PW 105 can be doped with any suitable P-type dopants. In some embodiments, PW 105, ESR0 104, DNW 102, and Psub 101 are made of the same material, e.g., silicon. In some embodiments, PW 105 can be made of silicon and doped with one or more of boron, aluminum, nitrogen, gallium, and indium. In some embodiments, the dopant concentration of PW 105 is about $10^{16}$ atoms/cm$^3$.

Isolation structures 1081 and 1082, separated by P+ region 109, surround NMOSFETs 111. Isolation structure 1082 insulates NMOSFETs 111 from P+ region 109. A bottom surface of isolation structure 1081 can be over the peripheral upper surface of ESR0 104. Isolation structures 1081 and 1082 are made of any suitable dielectric material, such as one or more of silicon oxide, spin-on-glass, silicon nitride, silicon oxynitride, fluorine-doped silicate glass (FSG), a low-k dielectric material. Isolation structures 1081 and 1082 can be shallow trench isolation (STI) structures. In some embodiments, isolation structures 1081 and 1082 are STI structures and are formed by etching trenches in PW 105. The trenches can be filled with insulating material, followed by a chemical mechanical polish (CMP) and etch-back process. Other fabrication techniques for forming isolation structures 1081 and 1082 are also possible. Isolation structures 1081 and 1082 can include a single-layered structure of multiple-layered structure.

P+ region 109 is formed in PW 105 between isolation structures 1081 and 1082. P+ region 109 can be made of any suitable material such as one or more of silicon, germanium, silicon carbide, allium arsenide, gallium phosphide, indium phosphide, indium arsenide, antimonide, SiGe, GaAdP, AllnAs, AlGaAs, GaInAs, GaInP, and GaInAsP. P+ region 109 can be heavily doped with P-type dopants and formed by ion implantation, ion diffusion, and/or in-situ doping with epitaxial deposition. In some embodiments, P+ region 109 and PW 105 are made of the same material (e.g., silicon) and can be formed by forming a P+ doped region in PW 105. The P-type dopants include one or more of boron, aluminum, nitrogen, gallium, and indium. Other fabrication methods for forming P+ region 109 are also possible.

For illustrative purposes, three NMOSFETs 111 are shown and labeled, each including a gate structure 110 and a pair of source and drain regions 106. Gate structure 110 includes a gate dielectric layer, a gate electrode layer, a spacer layer, and/or one or more additional layers. Gate structure 110 uses any suitable material, e.g., polysilicon, metal, metal-like material, as the gate electrode layer. In some embodiments, gate dielectric layer and spacer layer are each made of any suitable dielectric material such as silicon oxide, silicon nitride, silicon oxynitride, a low-k dielectric material, and any other suitable dielectric materials.

Source and drain regions 106 of NMOSMOSFETs 111 are heavily doped N-type regions formed in PW 105. Source and drain regions 106 can be made of one or more of silicon, germanium, silicon carbide, *allium* arsenide, gallium phosphide, indium phosphide, indium arsenide, antimonide, SiGe, GaAdP, AllnAs, AlGaAs, GaInAs, GaInP, and GaInAsP. In some embodiments, source and drain regions 106 and PW 105 are made of the same material, e.g., silicon, and source and drain regions 106 are doped with any suitable N-type dopants such as one or more of phosphorous, arsenic, antimony, bismuth, lithium, etc. In some embodiments, the dopant concentrations of source and drain region 106 can be in the range of about $10^{18}$-$10^{23}$ atoms/cm$^3$. In some embodiments, source and drain regions 106 are formed by one or more of ion implantation, ion diffusion, in-situ doping with epitaxial deposition, and any other suitable doping methods. Other fabrication methods for forming source and drain regions 106 are also possible. During operation, an N-type channel can be formed between the source electrode and the drain electrode and under the gate structure 110.

FIG. 1B illustrates a top view of exemplary NMOSFET device 100 of FIG. 1A. FIG. 1B shows the area coverage and relative positions of certain elements illustrated in FIG. 1A along a direction perpendicular to the upper surface of NMOSFET device 100. As shown in FIG. 1B, PW 105 underlies and can be partially covered by NMOSFETs 111 (labeled as "NMOS" in FIG. 1B); P+ region 109 (labeled as "P+ pick-up") can be positioned along the outer periphery of PW 105; isolation structure 1081 surrounds P+ region 109; ESR0 104 (sharing the same pattern with isolation structure 1081) underlies NMOSFETs 111, PW 105, and P+ region 109, and the outer boundary of ESR0 104 vertically aligns with the outer boundary of isolation structure 1081; NW 103 surrounds ESR0 104 and isolation structure 1081; DNW 102 underlies NW 103, ESR0 104, PW 105, isolation structure 1081, and NMOSFETs 111, where the outer boundary of DNW 102 vertically aligns with the outer boundary of NW 103; and N+ region (labeled as "N+ pick-up") surrounds isolation structure 1081, NMOSFETs 111, PW 105, and ESR0 104, and can be positioned along the outer periphery of NW 103. Because the area of DNW 102 can be equal to or larger than the total area of NMOSFETs 111 and surrounding isolation structure 1081, DNW 102 and NW 103 form an "enclosed space" that contains PW 105 and the NMOSFETs 111. ESR0 104 can thus be formed in the DNW-enclosed space. In FIGS. 1B-6B, an isolation and the underlying ESR structure is labeled as "isolation structure/ESR".

The arrangement of ESR0 104 reduces the susceptibility of NMOSFET device 100 to latch-up. During operation, ESR0 104 enables a longer depletion region to be formed between NW 103/DNW 102 and PW 105 and a lower electrical field to be formed in the longer depletion region. The insertion of ESR0 between PW 105 and NW 103/DNW 102 delays the carrier transportation across the interface between PW 105 and NW 103/DNW 102 and thus reduces the current flowing through PW 105. For example, a P+ region of a neighboring/adjacent NMOSFEET device (not shown) or PMOSFET device (not shown) can function as an emitter of an equivalent PNP BJT device, NW 103 or DNW 102 can function as a base of the PNP BJT device, and PW 105 can function as a collector of the PNP BJT device. When the base-emitter is forward biased, hole carriers are injected to the base and swept by the collector due to an electrical field across the interface between NW 103/DNW 102 and PW 105. With the arrangement of ESR0 104, the delay of hole carrier collection reduces the collector current and increases the base current. Accordingly, the current gain of the equivalent PNP BJT device can be reduced and less current flows in the latch-up paths, and latch-up is less likely to occur.

In another example, NW 103/DNW 102, PW 105, and a source and drain region 106 form an equivalent NPN BJT device. NW 103 or DNW 102 can function as the collector of the NPN BJT device, PW 105 can function as the base of the NPN BJT device, and a source and drain region 106 of NMOSFETs 111 can function as the emitter of the NPN BJT device. When the base-emitter is forward biased, electron carriers are injected to the base and swept by the emitter due to an electrical field across the interface between NW 103/DNW 102 and PW 105. With the arrangement of ESR0 104, the delay of electron carrier collection reduces the collector current and increases the base current. Accordingly, the current gain of the equivalent NPN BJT device can be reduced and less current is flowing into PW 105 and latch-up is less likely to occur. Thus, the reduced BJT current gains by ESR0 104, formed in the DNW-enclosed space, improves/increases the holding voltage of the latch-up paths. Accordingly, high-temperature induced holding voltage degradation can be reduced.

FIGS. 2A and 2B are illustrations of another exemplary NMOSFET device 200 that includes an ESR structure, according to some embodiments. As shown in FIG. 2A, different from NMOSFET device 100 shown in FIG. 1, NMOSFET device 200 further includes isolation structure 2083 surrounding NW 103. Instead of forming an ESR structure in the DNW-enclosed space, ESR1 204 outside the DNW-enclosed space can be formed. ESR1 204 can underlie isolation structure 2083 and surround NW 103, and can have a width W1 smaller than or equal to the width of isolation structure 1083. Width W1 of ESR1 204 can be in the range of about 0.1-10 µm. In some embodiments, width W1 is in the range of about 0.1-5 µm. Height H1 of ESR1 204 can be any suitable height along the direction vertical (e.g., y-direction) to the surface of NMOSFETs 111. In some embodiments, height H1 is the vertical distance between the lower surface of isolation structure 2083 and the upper surface of DNW 102. The material, dopant types, fabrication process, and/or dopant concentration range of ESR1 204 are the same as or similar to those of ESR0 104 illustrated in FIGS. 1A and 1B.

FIG. 2B illustrates a top view of an exemplary NMOSFET device 200 illustrated in FIG. 2A. Different from the top view shown in FIG. 1B, FIG. 2B shows isolation structure 2083 surrounding DNW 102 or the DNW-enclosed space. ESR1 204 (not shown in FIG. 2B) underlies isolation structure 2083. For ease of illustration, ESR1 204 shares the same pattern as isolation structure 2083 in FIG. 2B.

The arrangement of ESR1 204 reduces the susceptibility of NMOSFET device 200 to latch-up. During operation, a P+ region of a neighboring/adjacent NMOSFEET device (not shown) or PMOSFET device (not shown) can function as an emitter of an equivalent PNP BJT device, NW 103 or DNW 102 can function as a base of the PNP BJT device, and PW 105 can function as a collector of the PNP BJT device. The insertion of ESR1 204 increases the emitter resistance of parasitic PNP BJT, i.e., decreases the current flowing from the P+ region. That is, the input current to be amplified and current flowing into PW 105 can be reduced. Accordingly, the current flowing in the latch-up paths can be reduced and latch-up is less likely to occur. Thus, ESR1 204, formed outside the DNW-enclosed space, improves/increases the holding voltage of the latch-up paths and reduces the high-temperature induced degradation of the holding voltage.

FIGS. 3A and 3B are another illustration of an exemplary NMOSFET device 300 that includes an ESR structure, according to some embodiments. As shown in FIG. 3A, different from NMOSFET device 200 shown in FIG. 1A, NMOSFET device 300 further includes NW 3031 surrounding the DNW-enclosed space, isolation structure 3083 surrounding NW 3031, and NW 3032 surrounding isolation structure 3083. NW 3031 further includes N+ region 3071 formed therein and NW 3032 further includes N+ region 3072 formed therein. The dopant concentrations of NW 3032 and N+ region 3072 can be the same as, similar to, or different from the dopant concentrations of NW 3031 and N+ region 3071. Different from ESR0 and ESR1 illustrated in FIGS. 1A and 2A, respectively, an ESR2 304 in FIG. 3A can be formed in a space formed by NWs 3031 and 3032, isolation structure 3083, and DNW 102. That is, ESR2 304 can be inserted between NWs 3031 and 3032 in a DNW-enclosed space. ESR2 304 can be referred to as being formed along the outer periphery of the DNW-enclosed space. ESR2 304 can underlie isolation structure 3083 and surround NW 3031 along the outer boundary of NW 3031 and can have a width W2 less than or equal to the width of isolation structure 3083. Width W2 of ESR2 304 can be in the range of about 0.1-10 µm. In some embodiments, width W2 can be in the range of about 0.5-5 µm. Height H2 of ESR2 304 can be any suitable height along the direction vertical (e.g., y-direction) to the surface of NMOSFETs 111 and between the lower surface of isolation structure 3083 and the upper surface of DNW 102. In some embodiments, height H2 can be about the vertical distance between the lower surface of isolation structure 3083 and the upper surface of DNW 102. The material, dopant types, fabrication process, and/or dopant concentration range of ESR2 304 are the same as or similar to those of ESR0 104 illustrated in FIGS. 1A and 1B and/or ESR1 204 illustrated in FIGS. 2A and 2B.

FIG. 3B illustrates a top view of an exemplary NMOSFET device 300 illustrated in FIG. 3A. Different from the top view shown in FIG. 2B, FIG. 3B shows isolation structure 3083 surrounding NW 3031 and NW 3032 surrounding isolation structure 3083. ESR2 304, sharing the same pattern as isolation structure 3083, underlies isolation structure 1083 and surrounds NW 3031 along the outer boundary of NW 3031. That is, ESR2 304 is formed along the outer periphery of the DNW-enclosed space. The outer boundary of DNW 102 aligns with the outer boundary of NW 3032. N+ region 3072 is formed along the outer periphery of NW 3032 and N+ region 3071 is formed along the outer periphery of NW 3031.

The arrangement of ESR2 304 reduces the susceptibility of NMOSFET device 200 to latch-up. During operation, a P+ region of a neighboring/adjacent NMOSFEET device (not shown) or PMOSFET device (not shown) can function as an emitter of an equivalent parasitic PNP BJT device, NW 103 or DNW 102 can function as a base of the PNP BJT device, and PW 105 can function as a collector of the PNP BJT device. The insertion of ESR2 304 increases the base width/volume of the parasitic PNP BJT. Accordingly, the current gain of the equivalent PNP BJT device can be reduced and the parasitic resistance of the equivalent PNP BJT can be increased. Current flowing into the collector of the parasitic BJT (i.e., PW 105) can be reduced, thus reducing the likelihood of latch-up in NMOSFET device 300. Thus, the reduced current in the latch-up paths improves/increases the holding voltage of the latch-up paths and the high-temperature induced voltage degradation.

Figure 4B:
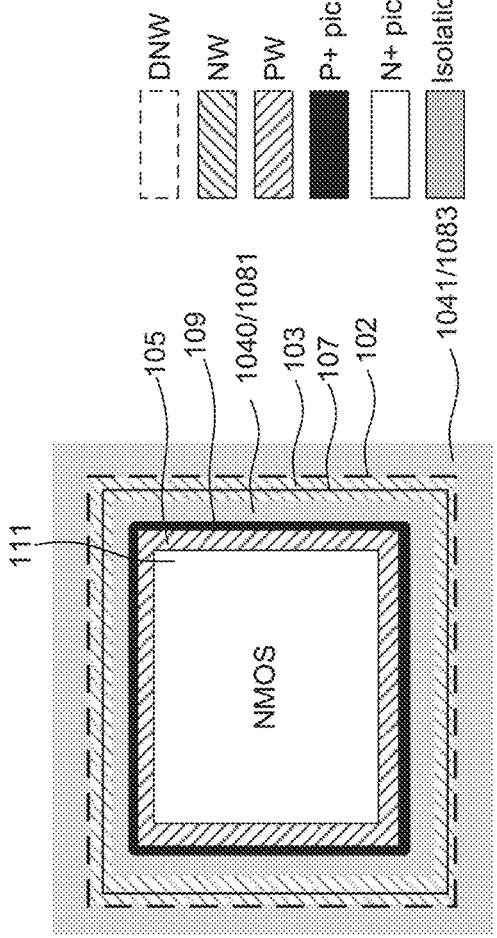
FIG. 4B is an illustration of an example top view of the NMOSFET device in FIG. 4A, according to some embodiments.

FIGS. 4A and 4B are illustrations of another exemplary NMOSFET device 400 that includes ESR structures, according to some embodiments. NMOSFET device 400 combines the arrangement of ESR structures illustrated in FIGS. 1A and 1B and FIGS. 2A and 2B. That is, ESR structures, i.e., ESR0 104 and ESR1 204, can be formed in and outside the DNW-enclosed space in one device. ESR0 104 illustrated corresponds to ESR0 104 illustrated in FIG. 1A and ESR1 204 corresponds to ESR1 204 illustrated in FIG. 2A. In some embodiments, the width W0 and height H0 of ESR0 104 are the same as or similar to the width W0 and height H0 of ESR0 104 illustrated in FIGS. 1A and 1B. In some embodiments, the width W1 and height H1 of ESR1 204 are the same as or similar to the width W1 and height H1 of ESR1 204 illustrated in FIGS. 2A and 2B. For ease of description, FIG. 4A is compared to FIG. 2A and FIG. 4B is compared to FIG. 2B. Different from FIG. 2A, FIG. 4A further illustrates ESR0 104 underlies and surrounds NMOSFETs 111. Accordingly, FIG. 4B shows ESR0 104 underlying and surrounding NMOSFETs 111. In FIG. 4B, ESR0 104 shares the same pattern as isolation structure 1081.

As previously explained for NMOSFET devices 100 and 200, forming ESR0 104 in the DNW-enclosed space and ESR1 204 surrounding the DNW-enclosed space further decreases the current flowing in the latch-up paths during operation. Accordingly, compared to NMOSFET device 100 or NMOSFET device 200, NMOSFET device 400 further reduces the susceptibility of latch-up, and the holding voltage of NMOSFET device 400 can be further improved/enhanced.

FIGS. 5A and 5B are illustrations of another exemplary NMOSFET device 500 that includes ESR structures, according to some embodiments. NMOSFET device 500 combines the arrangement of ESR structures illustrated in FIGS. 1A and 1B and FIGS. 3A and 3B. That is, ESR structures, i.e., ESR0 104 and ESR2 304, can be formed in the DNW-enclosed space and along the outer periphery of the DNW-enclosed space in one device. ESR0 104 corresponds to ESR0 104 illustrated in FIG. 1A. ESR1 304 corresponds to ESR2 304 illustrated in FIG. 3A. In some embodiments, the width W0 and height H0 of ESR0 104 are the same as or similar to the width W0 and height H0 of ESR0 104 illustrated in FIGS. 1A and 1B. In some embodiments, the width W2 and height H2 of ESR2 304 are the same as or similar to the width W2 and height H2 of ESR2 304 illustrated in FIGS. 3A and 3B. For ease of description, FIG. 5A is compared to FIG. 3A and FIG. 5B is compared to FIG. 3B. Different from FIG. 3A, FIG. 5A further illustrates ESR0 104 underlies and surrounds NMOSFETs 111. Accordingly, FIG. 5B shows ESR0 104 underlying and surrounding NMOSFETs 111. In FIG. 5B, ESR0 104 shares the same pattern as isolation structure 1081.

As previously explained for NMOSFET devices 100 and 300, forming ESR0 104 in the DNW-enclosed space and ESR2 304 along the outer periphery of the DNW-enclosed space reduces the current in the latch-up paths during operation. Accordingly, compared to NMOSFET device 100 or NMOSFET device 300, NMOSFET device 500 further reduces the susceptibility to latch-up, and the holding voltage of NMOSFET device 500 can be further improved/enhanced.

Figure 6A:
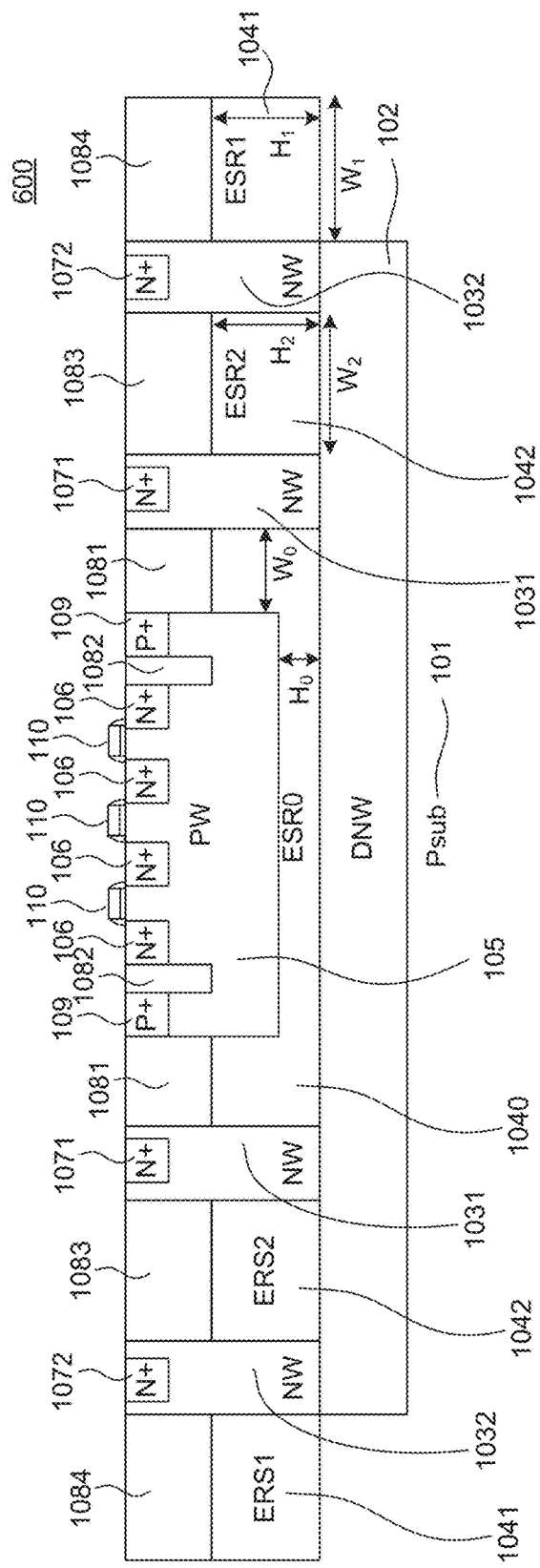
FIG. 6A is an illustration of an example cross-sectional view of another NMOSFET device, according to some embodiments.
Figure 6B:
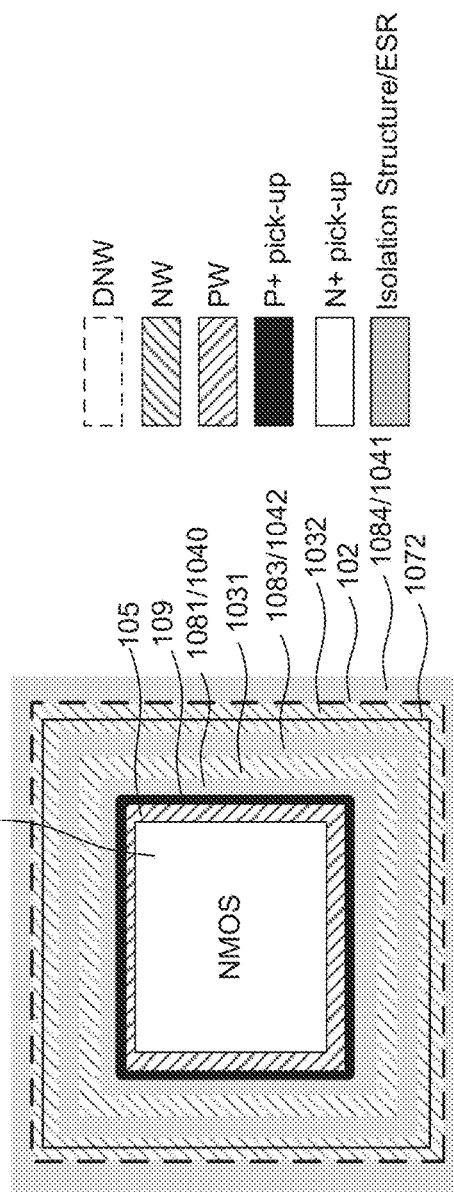
FIG. 6B is an illustration of an example top view of the NMOSFET device in FIG. 6A, according to some embodiments.

FIGS. 6A and 6B are illustration of another exemplary NMOSFET device 600 that includes ESR structures, according to some embodiments. NMOSFET device 600 combines the arrangement of ESR structures illustrated in FIGS. 1A, 1B, 2A, 2B, 3A, and 3B. That is, ESR structures, i.e., ESR0 104, ESR2 304, and ESR1 204, can be formed in the DNW-enclosed space, along the outer periphery of the DNW-enclosed space, and outside NW region 3032 in one device. ESR0 104 corresponds to ESR0 104 in FIG. 1A, ESR1 204 corresponds to ESR1 204 in FIG. 2A, and ESR2 304 in FIG. 3A corresponds to ESR2 304 in FIG. 3A. In some embodiments, the width W0 and height H0 of ESR0 104 are the same as or similar to the width W0 and height H0 of ESR0 104 illustrated in FIGS. 1A and 1B. In some embodiments, the width W1 and height H1 of ESR1 204 are the same as or similar to the width W1 and height H1 of ESR1 204 illustrated in FIGS. 2A and 2B. In some embodiments, the width W2 and height H2 of ESR2 304 are the same as or similar to the width W2 and height H2 of ESR2 304 illustrated in FIGS. 3A and 3B.

For ease of description, FIG. 6A is compared to FIGS. 4A and 5A, and FIG. 6B is compared to FIGS. 4B and 5B. FIG. 6A combines the ESR structures illustrated in FIGS. 4A/B an FIGS. 5A/B. FIG. 6A illustrates isolation structure 2083 and ESR1 204 underlies isolation structure 2083, isolation structure 3083 and ESR2 304 underlies isolation structure 3083, and isolation structure 1081 and ESR0 104 underlies isolation structure 1081. ESR1 204 can be outside and surrounds the DNW-enclosed space. ESR2 304 can be along the outer periphery of the DNW-enclosed space. ESR0 104 can underlie isolation structure 1081 and can surround NMOSFWTs 111. Accordingly, in FIG. 6B, ESR0 104 shares the same pattern as isolation structure 1081, ESR1 401 shares the same pattern as isolation structure 2083, ESR2 304 shares the same pattern as isolation structure 3083, and ESR0 shares the same pattern as isolation structure 1081.

As previously explained for NMOSFET devices 100-300, forming ESR0 104 in the DNW-enclosed space, ESR1 204 outside the DNW-enclosed space, and ESR2 304 along the outer periphery of the DNW-enclosed space each reduces the current flowing into PW 105 during operation. Thus, similar to NMOSFET devices 100-300, NMOSFET device 600 has reduced susceptibility to latch-up, and the holding voltage of NMOSFET device 600 can be further improved/enhanced. In some embodiments, the susceptibility of NMOSFET device 600 to latch-up is minimized compared to other ESR structure arrangements.

Figure 7B:
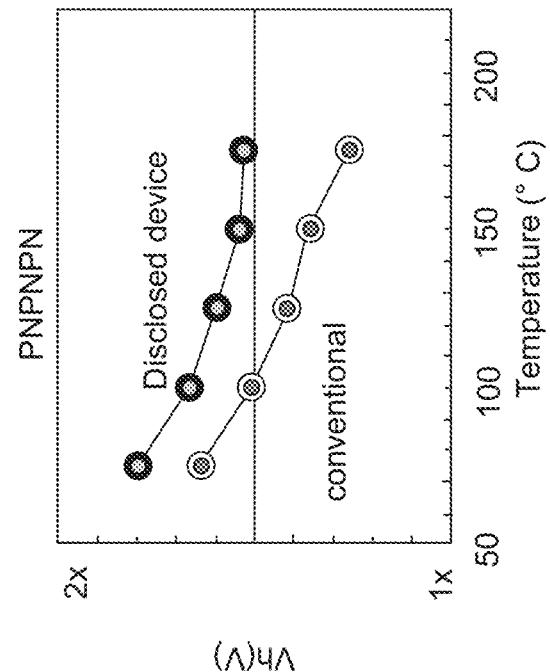
FIGS. 7A and 7B are illustrations of device performance characteristics of an NMOSFET device, according to some embodiments.
Figure 7A:
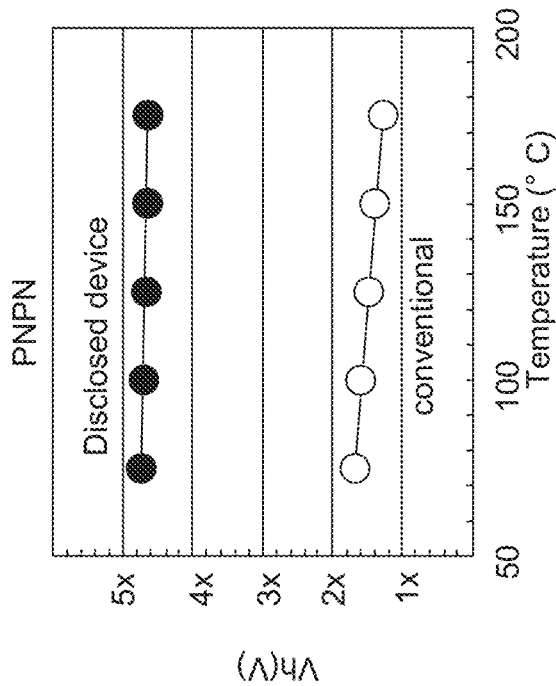

FIGS. 7A and 7B each illustrates a comparison of the holding voltage of an exemplary parasitic structure with and without the disclosed ESR structure(s), according to some embodiments. FIG. 7A illustrates the holding voltages of a PNPN parasitic structure (y-axis), in an NMOSFET device, as a function of temperature (x-axis) with and without a disclosed ESR structure(s). FIG. 7A shows that, over temperature, the holding voltage of the PNPN parasitic structure with a disclosed ESR structure is higher than a PNPN parasitic structure without the ESR structure. FIG. 7B illustrates the holding voltage of a PNPNPN parasitic structure, in an NMOSFET device, as a function of temperature with and without the disclosed ESR structure (s). FIG. 7B shows that, over temperature, the holding voltage of the PNPNPN parasitic structure with an ESR structure is higher than a PNPNPN parasitic structure without the ESR structure.

Figure 8:
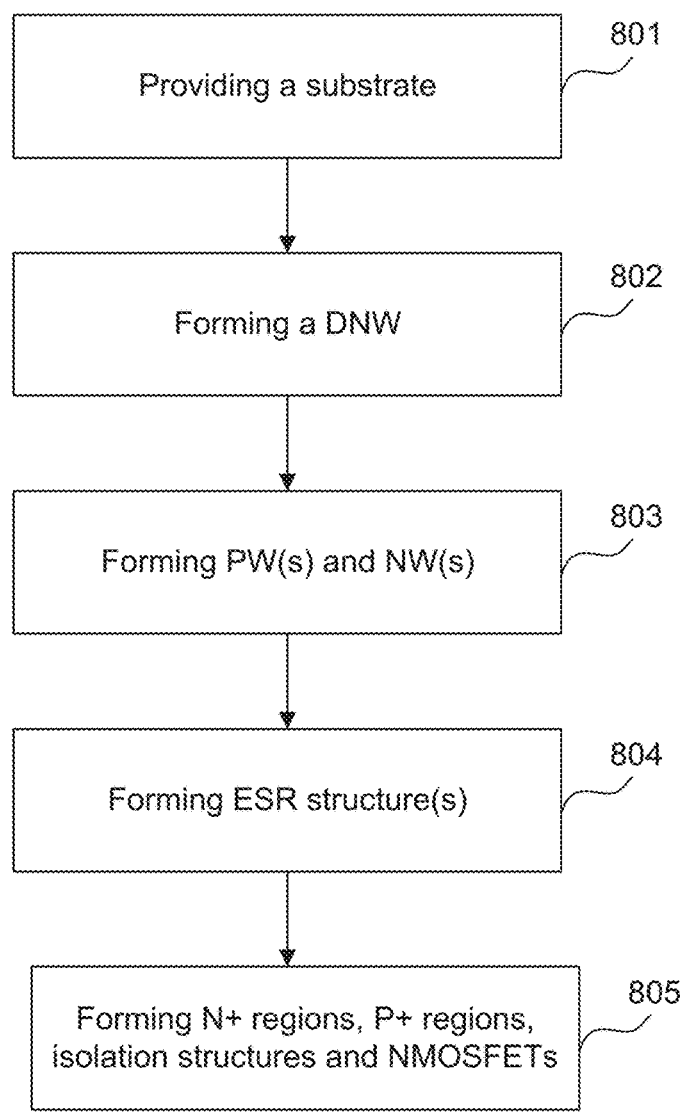
FIG. 8 is an illustration of an example fabrication process for forming embedded semiconductor region (ESR) structures, according to some embodiments.

FIG. 8 is an illustration of an exemplary method 800 for forming ESR structure(s), according to some embodiments. FIGS. 9A-9F illustrates cross-sectional view of structure 900 at various operations of method 800. For explanation purposes, the operations shown in method 800 are described in context of FIGS. 9A-9F. In various embodiments of the present disclosure, the operations of method 800 can be performed in a different order and/or vary.

In operation 801, a substrate can be provided. FIG. 9A illustrates an exemplary cross-sectional view of a structure 900. The substrate can be any suitable P-type substrate 901 (i.e., Psub). In some embodiments, the substrate can be a silicon substrate. In some embodiments, the substrate includes another elementary semiconductor, such as germanium, a compound semiconductor including silicon carbide, allium arsenide, gallium phosphide, indium phosphide, indium arsenide, and/or indium antimonide; an alloy semiconductor including SiGe, GaAdP, AlInAs, AlGaAs, GalnAs, GaInP, and/or GaInAsP; or combinations thereof. In some embodiments, the substrate is a semiconductor on insulator (SOI). In some embodiments, the substrate is an epitaxial material.

In referring to FIG. 8, in operation 802, a DNW can be formed in the substrate. In FIG. 9B, a DNW 902 can be formed by any suitable doping process. In some embodiments, DNW 902 can be formed by an ion implantation process. A first mask (mask 1) can be used to expose the region for forming DNW 902, as shown in FIG. 9B. An ion implantation process (indicated by the arrows) can be performed to dope any suitable N-type dopants/ions into Psub 901. In some embodiments, no mask can be used in the ion implantation process to form the DNW. That is, DNW 902 can be formed in the entire chip. The process parameters of the doping process are adjusted and controlled such that the dopants for DNW 902 result in a desired doping profile in the desired depth range in the substrate. In some embodiments, the depth of DNW 902 can be deeper than other subsequently-formed parts of the device. In some embodiments, after the doping process, an annealing process, e.g., rapid thermal annealing, can be performed to diffuse and activate the dopants.

In some embodiments, DNW 902 can be doped with any suitable N-type dopants. DNW 902 has an area larger than the subsequently-formed NMOSFETs and surrounds the NMOSFETs. In some embodiments, DNW 902 can be made of silicon and can be doped with N-type dopants such as one or more of phosphorous, arsenic, antimony, bismuth, lithium, etc. In some embodiments, the dopant concentration of DNW 902 can be in the range of about $10^{15}$-$10^{16}$ atoms/cm$^3$.

In referring to FIG. 8, in operation 803, PW(s) and NW(s) are formed in the substrate. FIG. 9C illustrates PWs 903-905 and NWs 906-907, which can be formed through ion implantation processes using respective masks. For example, as shown in FIG. 9C, a second mask (mask 2) can be used to expose regions for forming NWs 906-907, and a third mask (mask 3) can be used to expose regions for forming PWs 903-905. Any suitable P-type dopants/ion can be doped into regions of Psub 901 (exposed by mask 3) to form PWs 903-905, and any suitable N-type dopants/ions can be doped into regions of Psub 901 (exposed by mask 2) to form NWs 903-905. The formation order of PWs 903-905 and NWs 906-907 can vary in different applications. In this operation, DNW 902 and NW 907 form a DNW-enclosed space. The space between NWs 906 and 907 and DNW 902 form an outer periphery of the DNW-enclosed space.

The process parameters of the ion implantation processes can be controlled and adjusted such that the PWs and NWs are formed substantially over DNW 902. In some embodiments, a subsequent RTA process can be performed after an ion implantation process to diffuse and activate the dopants. In some embodiments, Psub 901, PWs 903-905, and NWs 906-907 include silicon. The P-type dopants include any suitable dopants/ions such as one or more of boron, aluminum, nitrogen, gallium, and indium. The N-type dopants include any suitable dopants/ions such as one or more of phosphorus, arsenic, antimony, bismuth, and lithium. The mask used for the ion implantations can include any suitable masks such as one or more of photoresist and dielectric materials.

In some embodiments, after DNW 902 is formed, a suitable deposition process is performed to deposit a semiconductor layer over DNW 902 for forming the subsequent PW(s), NW(s), ESR structures, NMOSFETs, and other related structures. The semiconductor layer can be made of a same material as DNW 902 and/or Psub 901. The semiconductor layer can also be made of a different material than DNW 902 and/or Psub 901. In some embodiments, an in-situ doping process can be used to form a desired dopant concentration within a desired depth range in the semiconductor layer. The doped region in the semiconductor layer can be used for forming subsequent initial ESR structures and/or PW(s). Further, one or more ion implantation processes can be performed to form NW(s) and/or PW(s), as illustrated in operation 804. For example, an in-situ doping process can be performed to dope the entire semiconductor layer to the desired dopant level of the subsequent initial ESR structures, and ion implantation processes can be performed to form PW(s) and NW(s).

The deposition process can include one or more of chemical vapor deposition (CVD), physical vapor deposition (PVD), plasma-enhanced CVD (PECVD), molecular beam epitaxy (MBE), sputtering, atomic layer deposition (ALD), and metal-organic chemical vapor deposition (MOCVD), and any suitable deposition techniques. The semiconductor layer can be made of one or more of silicon, germanium, silicon carbide, allium arsenide, gallium phosphide, indium phosphide, indium arsenide, antimonide, SiGe, GaAdP, AlInAs, AlGaAs, GaInAs, GaInP, GaInAsP, and any suitable semiconductor material.

Figure 9D:
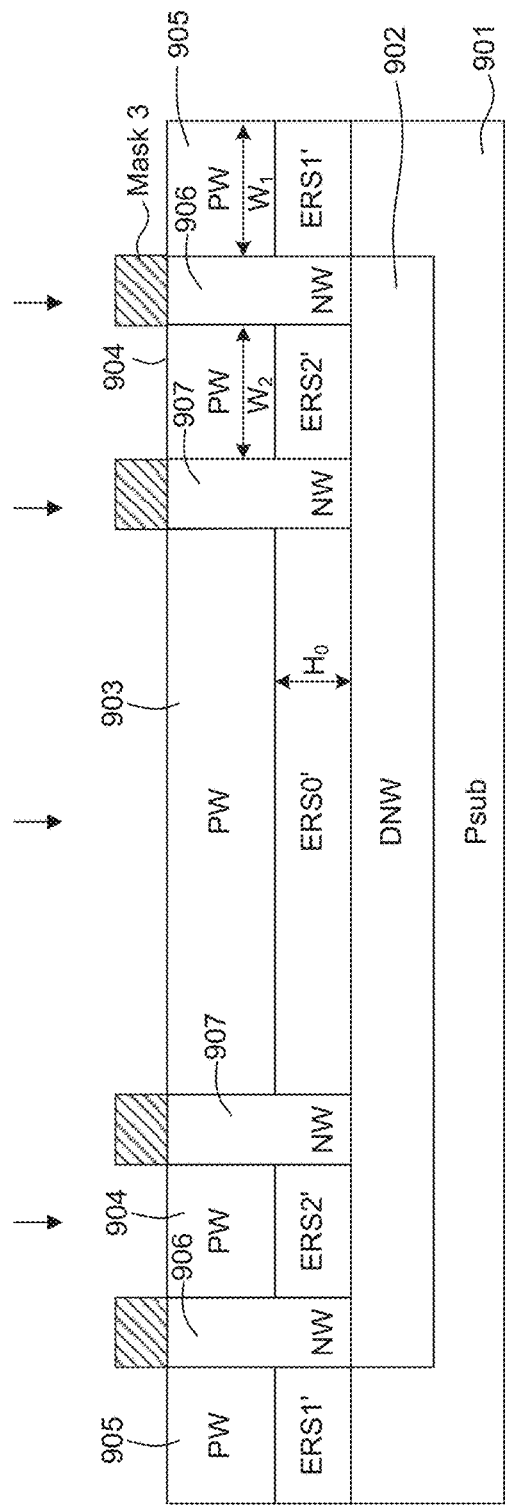

In referring to FIG. 8, in operation 804, one or more ESR structures are formed in the substrate. As shown in FIG. 9D, in some embodiments, mask 3 can be used for forming initial ESR regions ESR0', ESR1', and ESR2' in PWs 903-905. As an example, in FIG. 9D, by performing an ion implantation process, ESR0' can be formed in the DNW-enclosed space, ESR1' can be formed in outside the DNW-enclosed space, and ESR2' can be formed on the outer periphery of the DNW-enclosed space. Process parameters such as the implantation energy, dosage, and implantation time are controlled and adjusted so that the initial ESR regions are doped with desired dopant types, dopant concentrations, and doping depths. The height/thickness of ESR0' can be controlled to be about H0 from the top surface of DNW 902. The widths of ESR1' (W1) and ESR2' (W2) are approximately the same as the width of the respective PWs 905 and 904.

Figure 9E:
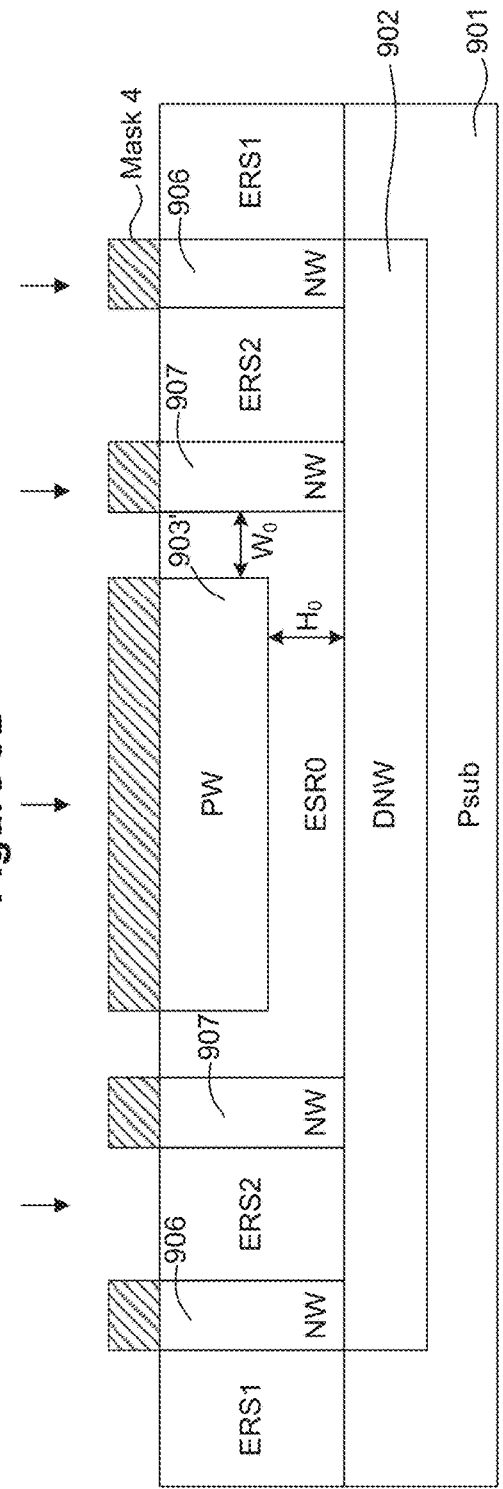

Further, as shown in FIG. 9E, in some embodiments, a fourth mask (mask 4) can be used for forming the ESR structures ESR0, ESR1, and ESR2. For example, mask 4 can be configured to cover a central portion of PW 903 and NWs 906 and 907. An ion implantation process can be performed to dope the exposed initial ESR regions and form the ESR structures ESR0, ESR1, and ESR2. For example, with mask 4, ESR0 can be formed to have a "U" cross-sectional shape. The width between a side boundary of the formed PW 903' (a remaining portion of PW 903 after the ion implantation process) can be about W0. That is, the U-shaped ESR0, formed in the DNW-enclosed space, has a height of about H0 and a width of about W0. The width W0 can be in the range of about 0.1-10 µm. In some embodiments, the width W0 can be in the range of about 0.1-5 µm. The height H0 can be in the range of about 0.1-10 µm. In some embodiments, height H0 can be in the range of about 0.1-5 µm.

In addition, initial ESR regions ESR1' and ESR2' are further doped to form ESR structures ESR1 and ESR2. That is, ESR0 can be formed in the DNW-enclosed space, ESR1 can be formed outside and surrounds the DNW-enclosed space, and ESR2 can be formed along the outer periphery of the DNW-enclosed space. The width W1 of ESR1 can be about 0.1-10 µm, and the width W2 of ESR2 can be about 0.5-5 µm. In this operation, the process parameters of the ion implantation such as implantation energy, implantation time, and dosage, are controlled to ensure sufficient dopants are properly doped into PWs 903-905 to form the ESR structures.

The formed ESR structures can be N-type, P-type, or intrinsic. The dopant concentration of the ESR structures can be in the range of about $0\text{-}10^{19}$ atoms/cm$^3$, where 0 represents intrinsic doping level. In some embodiments, suitable P-type dopants are doped into PWs to form P-type ESR structures. In some embodiments, suitable N-type dopants are doped into the PWs to neutralize or reverse the dopant type of the PWs so that the resulted ESR structures can have intrinsic doping level or N-type dopants. The process parameters of the ion implantation such as implantation energy, implantation time, and dosage, are properly controlled to obtain desired ESR structures.

Figure 9F:
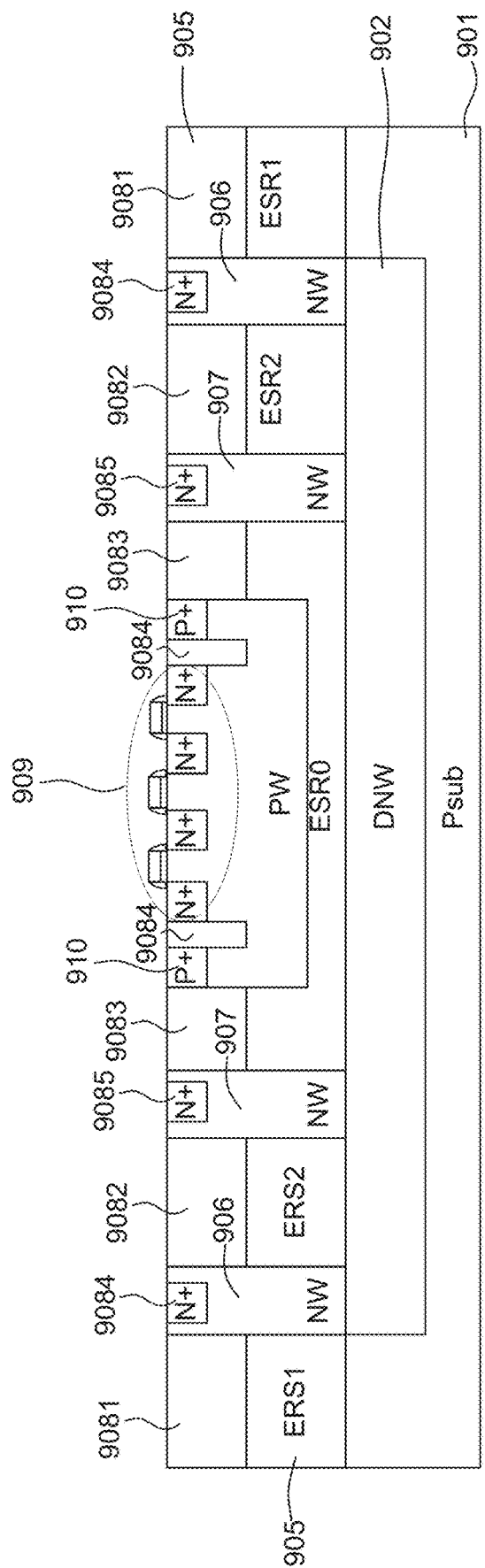

In referring to FIG. 8 in operation 805, N+ regions, P+ regions, isolation structures, and NMOSFETs are formed. FIG. 9F illustrates an exemplary cross-sectional view of structure 900 in this operation. Isolation structures 9081, 9082, and 9083 are formed over ESR1, ESR2, and ESR0, respectively. Isolation structure 9084 can be formed in PW 903'. Isolation structures 9081-9084 can be any suitable insulating structures such as STI. N+ regions 9084 and 9085 are formed in NWs 906 and 907, respectively. P+ region 910 can be formed between isolation structures 9083 and 9084. NMOSFETs 909 include three NMOSFETs, for illustrative purposes. The NMOSFETs 909 can include any suitable N-type MOSFETs such as planar MOSFETs and Fin field effect transistors (FinFETs).

For illustrative purposes, FIGS. 8 and 9A-9F describe the formation of three ESR structures (referring to the example ESR structures illustrated in FIG. 6A) in an NMOSFET device. In practice, a single ESR structure (referring to example ESR structures illustrated in FIGS. 1A-3A) or two ESR structures (referring to example ESR structures illustrated in FIGS. 4A and 5A) can also be formed in the NMOSFET device. In some embodiments, the fabrication process of the ESR structures can be compatible with existing fabrication process of NMOSFET device. No additional masks are needed for the formation of ESR structures. In various embodiments, different ESR structures can have varied dopant concentrations, depending on the design and/or application.

In various embodiments, ESR structures can also be formed in p-channel MOS field-effect transistor (PMOS-FET) devices. In some embodiments, the positions, structures, and dimensions of the ESR structures in a PMOSFET device can be similar to the ESR structures described in FIGS. 1-6, and the formation process of ESR structures in a PMOSFET device can be similar to the process described in FIGS. 8 and 9A-9F. In some embodiments, the doping types of parts/regions in a PMOSFET device are opposite of the doping types in a NMOSFET device. In some embodiments, the PMOSFET device has a N-type substrate (Nsub) and a deep P-well (DPW). An N-well (NW) can be formed over and surrounded by the DPW, and PMOSFETs can be formed in the NW. The ESR structures can be formed in the vicinity of the DPW. In some embodiments, the ESR structures can be N-type or P-type, and the doping levels of the ESR structures can be comparable to or similar to the doping levels of the ESR structures illustrated in FIGS. 1-6. The working mechanism of the ESR structures in a PMOSFET device can be similar to the working mechanism of the ESR in a NMOSFET device. In practice, a single ESR structure (referring to example ESR structures illustrated in FIGS. 1A-3A) or two ESR structures (referring to example ESR structures illustrated in FIGS. 4A and 5A) can also be formed in the PMOSFET device. In some embodiments, the fabrication process of the ESR structures can be compatible with an existing fabrication process of PMOSFET devices, in which no additional masks are needed for the formation of the ESR structures. In some embodiments, depending on the design and/or application, different ESR structures can have varied dopant concentrations.

Figure 10A:
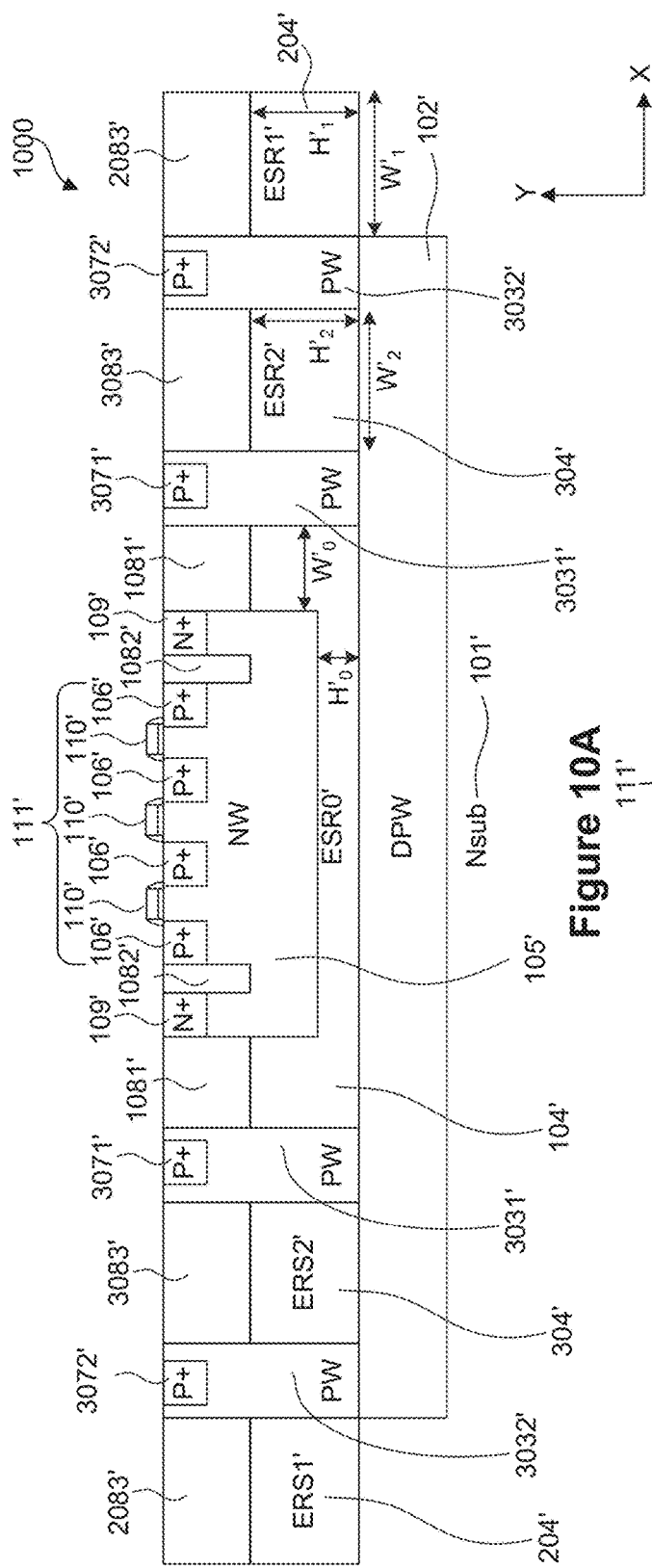
FIG. 10A is an illustration of an example cross-sectional view of a PMOSFET device, according to some embodiments.
Figure 10B:
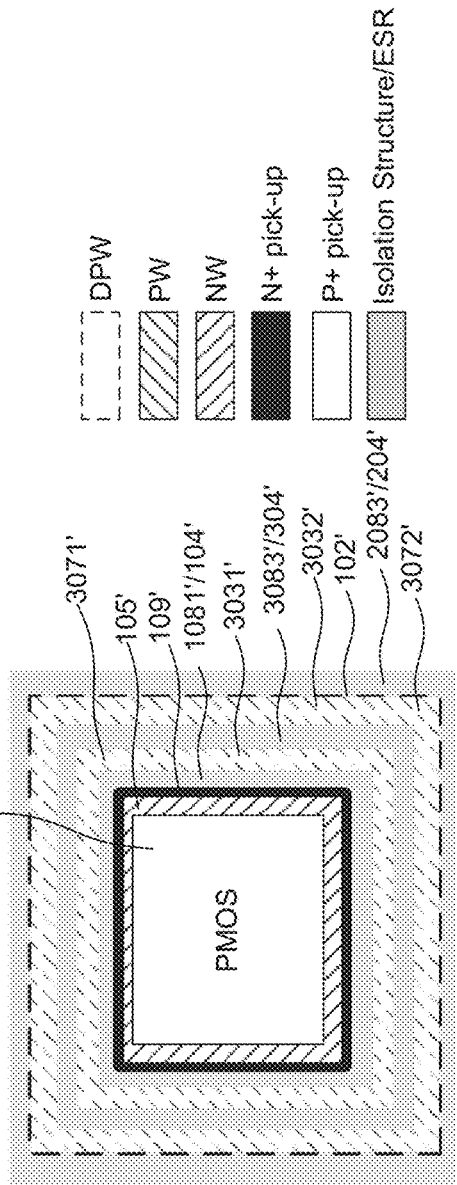
FIG. 10B is an illustration of an example top view of the PMOSFET device in FIG. 10A, according to some embodiments.

FIGS. 10A and 10B illustrate an exemplary cross-sectional view and an exemplary top view of a PMOSFET device 1000 with ESR structures. As an example, PMOSFET device 1000 has a structure similar to the structure of NMOSFET device 600 illustrated in FIGS. 6A and 6B. In some embodiments, the doping types of parts/regions in PMOSFET device 1000 are opposite of the doping types in NMOSFET device 600. For example, as shown in FIG. 10A, PMOSFET device 1000 includes an Nsub 101', a DPW 102', an NW 105', PWs 3031' and 3032', P+ regions 3071' and 3032', N+ region 109', source and drain regions 106', gate structures 110', isolation structures 1081', 1082', 3083', and 2083'. The PMOSFETs are represented by element 111'. PMOSFET device 1000 also includes ESR structures ESR0', ESR1', and ESR2', with widths and heights of (W0', H0'), (W1', H1'), and (W2', H2'), respectively. In some embodiments, the dopant level of an ESR structure in PMOSFET device 1000 is in a range from about intrinsic doping level of the material (e.g., material that NW 105' is made of) to about $10^{19}$ atoms/cm$^3$. In some embodiments, the dopant level of an ESR in PMOSFET 1000 is in a range from about $10^{15}$ atoms/cm$^3$ to about $10^{17}$ atoms/cm$^3$. The ESR structures ESR0'-ESR2' can reduce the occurrence of latch-up and improve device performance of PMOSFET device 1000.

The present disclosure describes an embedded semiconductor region (ESR) structure formed in the vicinity of the DNW of a NMOSFET device (or the DPW of a PMOSFET device) to reduce latch-up in the NMOSFET (or PMOSFET) device. A benefit, among others, of forming the ESR structure is to reduce the current along parasitic latch-up paths in the device. By reducing the current generated by parasitic structures along the latch-up paths, a holding voltage of the latch-up paths can be increased, thus reducing the occurrence of latch-up and improving device performance. Further, high-temperature induced holding voltage degradation can be suppressed. In some embodiments, the formation of the ESR structure is compatible with CMOS fabrication processes and does not require additional masks to fabricate the CMOS device.

In some embodiments, a MOSFET device (e.g., NMOSFET or PMOSFET device) includes a first-type substrate, a deep-second-type well in the first-type substrate, a first-type well over the deep-second-type well, and a second-type well over the deep-second-type well. The second-type well and the deep-second-type well form an enclosed space that includes the first-type well. The MOSFET also includes an ESR in a vicinity of the enclosed space. The ESR includes a dopant concentration lower than at least one of a dopant concentration of the first-type well, a dopant concentration of the second-type well, and a dopant concentration of the deep-second-type well.

In some embodiments, a method for forming a MOSFET device includes providing a first-type substrate, doping a first portion of the first-type substrate to form a deep-second-type-well in the first-type substrate, doping a second portion of the first-type substrate to form a first-type well and doping a third portion of the first-type substrate to form a second-type well over the deep-second-type well. The deep-second-type well and the second-type well form an enclosed space that includes the first-type well. The method also includes doping a fourth portion of the first-type substrate to form an ESR in a vicinity of the enclosed space, the ESR including a dopant concentration lower than at least one of a dopant concentration of the first-type well, a dopant concentration of the second-type well, and a dopant concentration of the deep-second-type well.

In some embodiments, a MOSFET device includes a first-type substrate, a deep-second-type well in the first-type substrate, a first-type well over the second-type well, and an second-type well over the deep-second-type well. The second-type well and the deep-second-type well form an enclosed space that includes the first-type well. The MOSFET also includes an isolation structure between the first-type well and the second-type well, at least one MOSFET over the first-type well; and an ESR surrounding the first-type well in the enclosed space and under the first-type well and the isolation structure. The ESR includes a dopant concentration lower than at least one of a dopant concentration of the first-type well, a dopant concentration of the second-type well, and a dopant concentration of the deep-second-type well.

It can be to be appreciated that the Detailed Description section, and not the Abstract of the Disclosure, can be intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A metal-oxide-semiconductor field-effect transistor (MOSFET) device, comprising:
   a substrate comprising a first dopant type;
   a deep well comprising a second dopant type and in the substrate, wherein the second dopant type is opposite to the first dopant type;
   a first well comprising the first dopant type and over the deep well;
   a drain region and a source region of at least one MOSFET within the first well;
   a second well comprising the second dopant type and over the deep well, wherein the second well and the deep well form an enclosed space that includes first well;
   a first embedded semiconductor region (ESR) in a vicinity of the enclosed space, wherein the first ESR is intrinsic;
   a third well comprising the second dopant type and over the deep well; and
   a second ESR over the deep well and between the second and third wells, wherein the second ESR is intrinsic.

2. The MOSFET device of claim 1, wherein the first and second dopant types are p-type and n-type, respectively.

3. The MOSFET device of claim 1, wherein the first ESR includes a U-shaped portion in the enclosed space and between the first well and an inner sidewall of the enclosed space.

4. The MOSFET device of claim 3, wherein the U-shaped portion has a height between about 0.1 µm and about 10 µm between the deep well and the first well and has a width between about 0.1 µm and about 10 µm between the first well and the inner sidewall of the enclosed space.

5. A metal-oxide-semiconductor field-effect transistor (MOSFET) device, comprising:
   a p-type substrate;
   a deep n-type well in the p-type substrate;
   a p-type well over the deep n-type well;
   a drain region and a source region of at least one MOSFET within the p-type well;
   a first n-type well over the deep n-type well, the first n-type well and the deep n-type well surrounding the p-type well;
   an isolation structure between the p-type well and the first n-type well;
   at least one MOSFET over the p-type well;
   a first embedded semiconductor region (ESR) surrounding the p-type well and under the p-type well and the isolation structure, wherein the first ESR is intrinsic;
   a second n-type well over the deep n-type well; and
   a second ESR between the first and second n-type wells and over the deep n-type well wherein the second ESR is intrinsic.

6. The MOSFET device of claim 5, wherein the first ESR includes a U-shaped portion between the p-type well and the deep n-type well.

7. A metal-oxide-semiconductor field-effect transistor (MOSFET) device, comprising:
   a substrate comprising a first dopant type;
   a deep well comprising a second dopant type and in the substrate;
   a first well comprising the first dopant type and over the deep well;
   at least one MOSFET over the deep well, wherein a drain region and a source region of the at least one MOSFET are formed within the first well;

second and third wells comprising the second dopant type and on the deep well, wherein the first well is formed between the second and third wells;
a first embedded semiconductor region (ESR) under the first well and above the deep well, wherein the first ESR is intrinsic and abuts the second and third wells;
a fourth well comprising the second dopant type and on the deep well; and
a second ESR over the deep well and between the third and fourth wells, wherein the second ESR is intrinsic.

8. The MOSFET device of claim 7, wherein at least portions of the first ESR are between the first well and the second well and between the first well and the third well.

9. The MOSFET device of claim 7, wherein the first and second dopant types are p-type and n-type, respectively.

10. The MOSFET device of claim 6, wherein the U-shaped portion has a height between about 0.1 μm and about 10 μm between the deep n-type well and the p-type well.

11. The MOSFET device of claim 7, wherein the first ESR is between the first well and the second or third wells.

12. The MOSFET device of claim 7, wherein the second and third wells are in physical contact with the deep well.

13. The MOSFET device of claim 1, wherein the second ESR is in physical contact with the deep well and the second and third wells.

14. The MOSFET device of claim 7, wherein a dopant concentration of the first well is different from a dopant concentration of the first ESR.

15. The MOSFET device of claim 7, further comprising a first heavily doped region doped with the second dopant type and embedded in the second well, wherein a dopant concentration of the first heavily doped region is greater than a dopant concentration of the second well.

16. The MOSFET device of claim 15, further comprising a second heavily doped region doped with the second dopant type and embedded in the fourth well, wherein a dopant concentration of the second heavily doped region is greater than a dopant concentration of the fourth well.

17. The MOSFET device of claim 1, further comprising a first heavily doped region doped with the second dopant type and embedded in the second well, wherein a dopant concentration of the first heavily doped region is greater than a dopant concentration of the second well.

18. The MOSFET device of claim 17, further comprising a second heavily doped region doped with the second dopant type and embedded in a fourth well, wherein a dopant concentration of the second heavily doped region is greater than a dopant concentration of the fourth well.

19. The MOSFET device of claim 5, further comprising a heavily doped p-type region embedded in the p-type well, wherein a dopant concentration of the heavily doped p-type region is greater than a dopant concentration of the p-type well.

20. The MOSFET device of claim 19, further comprising a heavily doped n-type region embedded in the second n-type well, wherein a dopant concentration of the heavily doped n-type region is greater than a dopant concentration of the second n-type well.

* * * * *